United States Patent [19]
Moody

[11] Patent Number: 5,886,543
[45] Date of Patent: Mar. 23, 1999

[54] POWER SEMICONDUCTOR SWITCH HAVING A LOAD OPEN-CIRCUIT DETECTION CIRCUIT

[75] Inventor: Paul T. Moody, Oldham, Great Britain

[73] Assignee: U.S. Philips Corporation, NY, N.Y.

[21] Appl. No.: 953,103

[22] Filed: Oct. 17, 1997

Related U.S. Application Data

[63] Continuation of Ser. No. 575,539, Dec. 20, 1995, abandoned.

[30] Foreign Application Priority Data

Dec. 22, 1994 [GB] United Kingdom ............... 9426007

[51] Int. Cl.⁶ .................................................. H03K 5/153
[52] U.S. Cl. ............................... 327/77; 327/18; 327/20; 327/427; 327/434; 327/436; 327/437; 327/525; 315/129; 315/130; 324/503; 340/641; 340/642; 340/458
[58] Field of Search ................................ 327/18, 20, 427, 327/434, 436, 437, 77, 525; 315/129, 130; 324/503; 340/641, 642, 458

[56] References Cited

U.S. PATENT DOCUMENTS

| | | | |
|---|---|---|---|
| 3,660,813 | 5/1972 | Rumpf | 340/458 |
| 4,234,878 | 11/1980 | Stark | 340/462 |
| 4,236,143 | 11/1980 | Mizuno | 340/475 |
| 4,349,810 | 9/1982 | Kugo et al. | 340/458 |
| 4,745,339 | 5/1988 | Izawa et al. | 315/130 |
| 5,164,659 | 11/1992 | Schultz et al. | 323/351 |
| 5,266,840 | 11/1993 | Leipold et al. | 307/125 |
| 5,446,397 | 8/1995 | Yotsuyanagi | 327/77 |

Primary Examiner—Kenneth B. Wells
Attorney, Agent, or Firm—Steven R. Biren

[57] ABSTRACT

A power semiconductor device (2) has a first main electrode (S) for coupling to a first supply line (3), a second main electrode (D) coupled to a first terminal (4) for connection via a load (L) to a second voltage supply line (5) and an insulated gate electrode (G) coupled to a control terminal (GT) for supplying a gate control signal to enable conduction of the power semiconductor device (2). An open-circuit detection arrangement is integrated with the power semiconductor device (2) for providing an indication that a load (L) coupled to the power semiconductor device (2) is open-circuited. The detection arrangement has a reference current (Ir) providing arrangement (7, R3, R4, R7, Q1, Q2) and a current deriving arrangement (Q3, Q4) for deriving a current (Id) dependent on the voltage at the second main electrode (D). The detection arrangement provides an output signal (OS) to indicate that the load (L) is operating normally when the derived or detected current (Id) is greater than the reference current (Ir). This should allow accurate determination of the status of the load (L) because the use of the reference current (Ir) allows account to be taken of possible leakage current paths around the load (L) so that an indication that the load (L) is operating correctly and is not open-circuit is only given when the derived current (Id) is greater than the reference current (Ir).

9 Claims, 3 Drawing Sheets

FIG. 5

POWER SEMICONDUCTOR SWITCH HAVING A LOAD OPEN-CIRCUIT DETECTION CIRCUIT

This is a continuation of application Ser. No. 08/575,539, filed Dec. 20, 1995 now abandoned.

BACKGROUND OF THE INVENTION

This invention relates to a power semiconductor switch, in particular a power semiconductor switch comprising a power semiconductor device having a first main electrode for coupling to a first voltage supply line, a second main electrode coupled to a first terminal for connection via a load to a second voltage supply line and an insulated gate electrode coupled to a control terminal for supplying a gate control signal to enable conduction of the power semiconductor device and an arrangement for determining whether or not the load is present, that is for determining whether or not the load is open-circuited. Such an open-circuit detection arrangement may be used to determine whether, for example, a lamp or bulb operated by the power semiconductor switch has blown. The invention also relates to an automotive electrical system comprising such a power semiconductor switch.

Where a power semiconductor device such as an n-channel enhancement mode power MOSFET is being operated as a low-side switch, that is where the voltage supplied to the second voltage supply line is more positive than the voltage supplied to the first voltage supply line, then the voltage between the first and second main electrodes of the power semiconductor device will depend on the status of the power semiconductor device and of the load.

Thus, when the power semiconductor device is switched off (that is it is not conducting) by removing the gate control signal and the load is connected (that is the load is not open-circuited), then the voltage at the second main electrode of the power semiconductor device will be high because it will be at the potential of the voltage supply, generally battery voltage where the protected switch is being used for an automotive application. If, however, the load becomes open-circuited for some reason, then the voltage between the first and second main electrodes of the non-conducting power semiconductor device will be zero.

In contrast, when the power semiconductor device is conducting, then the voltage between the first and second main electrodes will be very low when the load is operating normally (because the on-resistance of the power semiconductor device will be low compared to the resistance of the load) and will be zero when the load is open-circuited. It is thus very difficult to detect when a load is open-circuited when the power semiconductor device is conducting.

It ought to be relatively easy to check whether a load is operating normally (ie is not open-circuited) when the power semiconductor switch is not conducting, that is when the gate control signal is not applied to the insulated gate electrode of the power semiconductor device. However, even if the load itself is faulty, moisture or dirt in the applications environment may induce a leakage current that may pull the voltage at the second main electrode of the power semiconductor device high, even though the load is open-circuited. Accordingly, the presence of such a leakage current path may make it difficult to detect an open-circuited load even when the power semiconductor device is not conducting.

Previous attempts at detecting an open-circuit condition of a load have involved the user of the power semiconductor switch, for example an automobile manufacturer, coupling an external resistor between the first and second main electrodes of the power semiconductor device to draw off a portion of the current through the power semiconductor device in an attempt to detect whether the load is open-circuited when the power semiconductor device is non-conducting.

The use of such an external resistor means, however, that there is a permanent leakage of current from the power supply that may in time cause a drain on the power supply and could result in a flat battery where the power semiconductor switch is being used for an automotive application. Moreover, there is a danger of the external resistor becoming detached so that the power semiconductor switch is no longer able to indicate whether the load is open-circuited. In addition, such a technique involves additional expense and effort for the user of the power semiconductor switch.

SUMMARY OF THE INVENTION

It is an aim of the present invention to provide a power semiconductor switch capable of providing an indication that a load coupled to the switch is open-circuited and which avoids or at least mitigates the above-mentioned problems.

According to one aspect of the present invention, there is provided a power semiconductor switch comprising a power semiconductor device having a first main electrode for coupling to a first voltage supply line, a second main electrode coupled to a first terminal for connection via a load to a second voltage supply line and an insulated gate electrode coupled to a control terminal for supplying a gate control signal to enable conduction of the power semiconductor device, and an open-circuit detection arrangement integrated with the power semiconductor device for providing an indication that a load coupled to the power semiconductor device is open-circuited, the detection arrangement comprising means for providing a reference current and means for deriving a current dependent on the voltage at the second main electrode and for providing an output signal to indicate that the load is operating normally when the derived current is greater than the reference current.

A power semiconductor switch in accordance with the invention thus avoids the need for external components and, moreover, should allow accurate determination of the status of the load because the use of the reference current allows account to be taken of possible leakage current paths around the load so that an indication that the load is operating correctly and is not open-circuited is only given when the derived current is greater than the reference current.

According to another aspect of the present invention, there is provided an automotive electrical system comprising first and second voltage supply lines, a load coupled to the second voltage supply lines, and a power semiconductor switch for switching the load, the power semiconductor switch comprising a power semiconductor device having a first main electrode coupled to the first voltage supply line, a second main electrode coupled to a first terminal which is connected via the load to the second voltage supply line and an insulated gate electrode coupled to a control terminal for supplying a gate control signal to enable conduction of the power semiconductor device for switching the load, and an open-circuit detection arrangement integrated with the power semiconductor device for providing an indication that the load coupled to the power semiconductor device is open-circuited, the detection arrangement comprising means for providing a reference current, means for deriving a current dependent on the voltage at the second main electrode, and means for providing an output signal to indicate that the load is operating normally when the derived current is greater than the reference current.

The reference current providing means may comprise a current mirror comprising first and second transistors with the second transistor being capable of carrying a current larger by a predetermined ratio than the first transistor, the first and second transistors each having first and second main electrodes and a control electrode with the first main electrode of each of the first and second transistors being coupled to the first voltage supply line, the second main electrode of the first transistor being coupled to an auxiliary voltage supply line, the first transistor being diode-connected, the control electrodes of the first and second transistors being coupled together and the second main electrode of the second transistor being coupled to receive the current dependent on the voltage at the second main electrode of the power semiconductor device.

Such an arrangement allows the use of a very low current source for providing the reference current. The very low current source may therefore be derived from any suitable source, for example a microprocessor controlling one or more such power semiconductor switches.

The current deriving and output providing means may comprise a further current mirror comprising third and fourth transistors with the third transistor being capable of carrying a current larger by a predetermined ratio than the fourth transistor, the third and fourth transistors each having first and second main electrodes and a control electrode with the second main electrode of each of the third and fourth transistors being coupled to the second main electrode of the power semiconductor device, the first main electrode of the third transistor being coupled to the second main electrode of the second transistor, the third transistor being diode-connected, the control electrodes of the third and fourth transistors being coupled together and the first main electrode of the fourth transistor being coupled to an output signal providing arrangement.

This should enable a reasonable current, that is a current higher than a normal leakage current and which may be selected to be, typically, 1 mA (milliampere), be to derived but at a low voltage so avoiding or at least reducing the possibility of an excessive drain of power from the second voltage supply line. In addition, if the voltage at the auxiliary voltage supply line is held low, the open circuit detection means should not draw current from the load. Accordingly the open-circuit detection means can be rendered non-operative when required allowing, for example, the open-circuit detection means to be used simply to check the status of a load immediately before a signal is supplied, for example from a controlling microprocessor, to the power semiconductor switch to render the power semiconductor device conducting. Accordingly, the open-circuit detection means should not significantly affect the normal operation of the switch and, in particular, should not draw any current from the load supply line during conduction of the power semiconductor device, if the voltage at the auxiliary supply line is turned off or held low.

The output providing arrangement may comprise another current mirror comprising fifth and sixth transistors with the fifth transistor being capable of carrying a current larger by a predetermined ratio than the sixth transistor, the fifth and sixth transistors each having first and second main electrodes and a control electrode with the first main electrode of each of the fifth and sixth transistors being coupled to the first voltage supply line, the second main electrode of the fifth transistor being coupled to the first main electrode of the fourth transistor, the fifth transistor being diode-connected, the control electrodes of the fifth and sixth transistors being coupled together, and the second main electrode of the sixth transistor being coupled to provide a voltage determining the output signal. Such an arrangement should further facilitate the use of a low reference current source while allowing for accurate detection of the value of the derived current. Such an arrangement may be driven from a microprocessor output and may be accurately matched to the reference current providing means. As another possibility, the said other current mirror could be replaced by a current sensing resistor and the voltage across the resistor then detected but the accuracy would not be as good.

The second main electrode of the sixth transistor may be coupled via resistance means to the auxiliary voltage supply line and to an output inverter stage for providing the output signal dependent on the voltage at the second main electrode of the sixth transistor. This use of resistance means avoids the need for complementary MOS devices (for example PMOS devices where the remainder of the switch comprises NMOS devices) which might, because for example of parasitic bipolar problems, be difficult to use in such circumstances without resorting to a complex buried layer technology.

The output inverter stage may comprise a further transistor having first and second main electrodes and a control electrode with the control electrode of the further transistor being coupled to the second main electrode of the sixth transistor and the first and second main electrodes of the further transistor being coupled between the first and auxiliary voltage supply lines.

Disabling means may be coupled to the insulated gate electrode of the power semiconductor device for disabling the open-circuit detection arrangement when the power semiconductor device is conducting.

In one example, disabling means may be provided for coupling the control electrode of the further transistor to the first voltage supply line when the power semiconductor device is conducting. The disabling means may comprise another transistor having first and second main electrodes coupled between the control electrode of the further transistor and the first voltage supply line and a control electrode coupled to the control terminal of the power semiconductor device. This should ensure that an open-circuit detection indication is provided only when the power semiconductor device is not conducting. This provides a simple but effective way of detecting the voltage at the insulated gate electrode of the power semiconductor device.

The control electrode of said other transistor may be coupled to the control terminal of the power semiconductor device by an input buffer.

BRIEF DESCRIPTION OF THE DRAWING

Embodiments of the present invention will now be described, by way of example, with reference to the accompanying drawing, in which.

DESCRIPTION OF THE PREFERRED EMBODIMENTS

It should of course be understood that the drawings are not to scale and that like reference numerals are used throughout text to refer to like parts.

Figure 1:
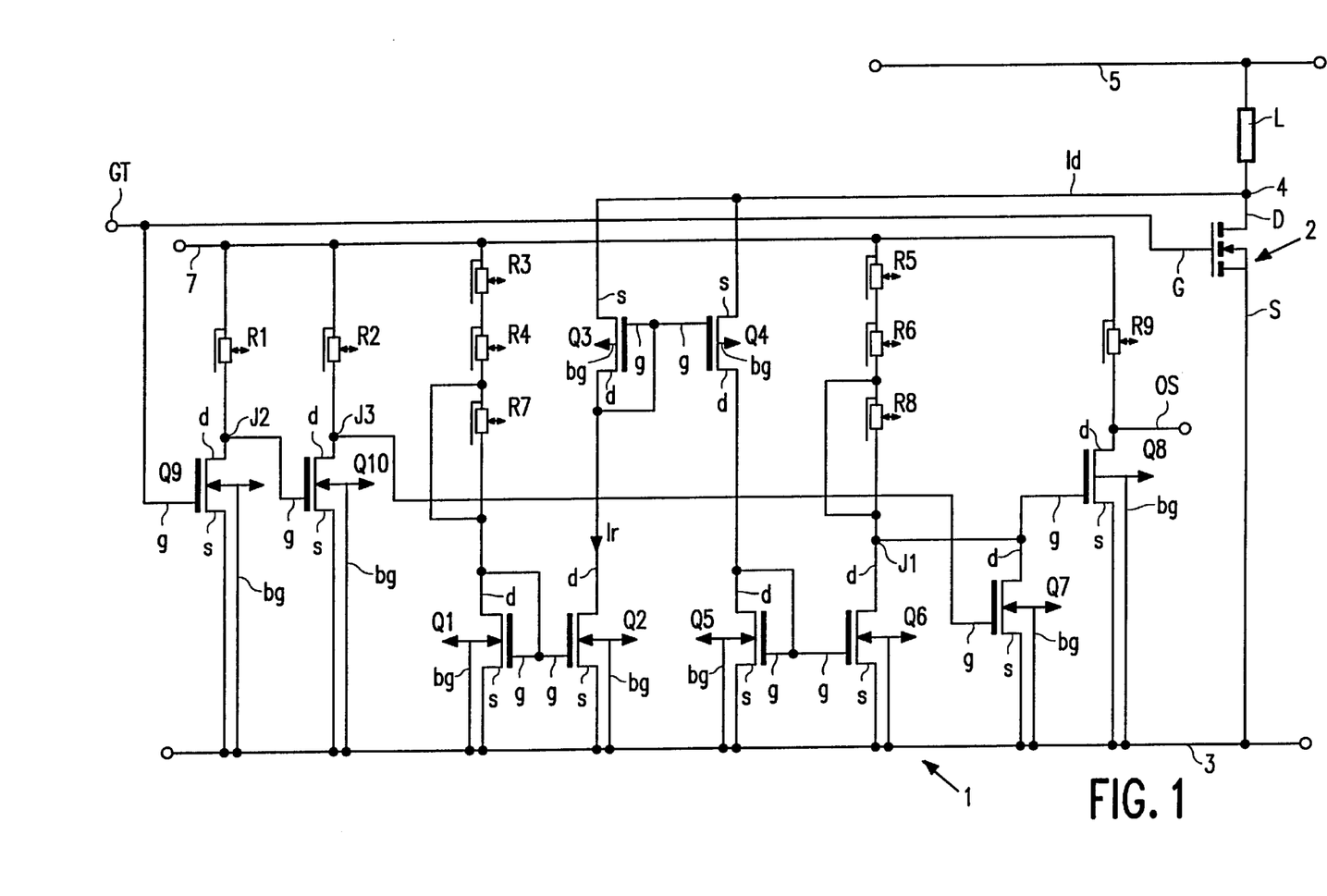
FIG. 1 is a circuit diagram illustrating one example of a power semiconductor switch and an automotive electrical system, both in accordance with the present invention.

Referring now to the drawings, especially FIG. 1, there is illustrated a power semiconductor switch 1 comprising a power semiconductor device 2 having a first main electrode S for coupling to a first voltage supply line 3, a second main electrode D coupled to a first terminal 4 for connection via a load L to a second voltage supply line 5 and an insulated gate electrode G coupled to a control terminal GT for supplying a gate control signal to enable conduction of the power semiconductor device 2, and an open-circuit detection arrangement integrated with the power semiconductor device 2 for providing an indication that a load L coupled to the power semiconductor device 2 is open-circuited, the detection arrangement comprising means 7, R3, R4, R7, Q1, Q2 for providing a reference current Ir and means Q3, Q4 for deriving a current Id dependent on the voltage at the second main electrode D and for providing an output signal OS to indicate that the load L is operating normally when the derived current Id is greater than the reference current Ir.

A power semiconductor switch 1 in accordance with the invention thus avoids the need for external components and, moreover, should allow accurate determination of the status of the load L because the use of the reference current Ir (which can be selected to be higher than any expected leakage current) allows account to be taken of possible leakage current paths around the load L so that an indication that the load L is operating correctly and is not open-circuited is only given when the derived current Id is greater than the reference current Ir.

As shown in FIG. 1, the power semiconductor device 2 comprises an n-channel enhancement mode power MOSFET 2 coupled as a low side switch for a load L. That is, the drain electrode D of the MOSFET 2 is coupled to a first terminal 4 while the load L is coupled between the first terminal 4 and the more positive second voltage supply line 5. The source electrode S of the MOSFET 2 is coupled to the more negative first voltage supply line 3. Generally speaking, the first voltage supply line 5 will be connected to ground (earth) while the second voltage supply line 3 will be connected to a suitable positive potential, for example battery potential where the power semiconductor switch is intended for use in an automobile. The control or gate electrode G of the power MOSFET 2 is coupled to a gate drive circuit (not shown) via a gate input voltage terminal GT. The gate drive circuit may be of any suitable conventional form.

The load L may be any suitable load, for example an automobile lamp or bulb or an automotive field coil.

The term "enhancement mode" means that the device is not conducting when appropriate voltages are applied to the first and second main electrodes but no voltage (that is zero volts) is applied to the control electrode and that the device is rendered conducting by applying a non-zero voltage to the control electrode.

The reference current providing means comprises a first current mirror. As shown in FIG. 1, the first current mirror is formed by first and second n-channel enhancement mode insulated gate field effect transistors (IGFETs) Q1 and Q2. The first and second IGFETs Q1 and Q2 are ratio matched, that is they have different conduction channel width to length ratios W/L so that the second IGFET Q2 is capable of carrying a current larger by a predetermined ratio than the first Q1. In this example, the first and second IGFETs have the same channel length L, typically 5 micrometers ($\mu$m) while the second IGFET Q1 has a channel width about 50 times that of the first IGFET Q1. Thus, the second IGFET Q2 may have a channel width of 1060 $\mu$m while the first IGFET Q1 may have a channel width of 20 $\mu$m. The actual widths are not important and may be determined by the capability of the processing technology to match the components in the desired predetermined ratio and provide the desired characteristics. Of course, a certain minimum channel width may be required to enable an IGFET to conduct a required current whilst keeping the voltage drop across that IGFET to a reasonable level, for example less than 1 volt.

The first main or source electrode s of each of the first and second IGFETs Q1 and Q2 is coupled to the first voltage supply line 3. The first IGFET Q1 is diode-connected (that is its gate or control electrode and its drain electrode are coupled together) and the control electrode g of the second IGFET Q2 is coupled to the control electrode g of the first IGFET Q1. The second main or drain electrode d of the first IGFET Q1 is also coupled to an auxiliary voltage supply line 7 via a suitable resistance. In the example shown in FIG. 1, the resistance comprises two series-connected resistors R3 and R4 providing a resistance of, typically, 200K (KiloOhms). A further resistor R7 may be coupled in series with the resistors R3 and R4 by breaking a shorting link 9 to increase the resistance to, typically, 250K. A reference voltage is supplied to the auxiliary voltage supply line 7. The value of the reference voltage and the resistance coupling the drain electrode d of the IGFET Q1 to the auxiliary voltage supply line 7 determine the reference current source for providing the reference current Ir.

Such an arrangement allows the value of the current source to be tailored to meet a customer's requirements and the use of high resistor values allows a very low value current source for providing the reference current Ir. Thus the reference current may therefore be derived from any suitable source, for example a microprocessor controlling one or more such power semiconductor switches.

The second main or drain electrode d of the IGFET Q2 is coupled to the first main or drain electrode d of a p-channel enhancement mode diode-connected third IGFET Q3 having its second main or source electrode s coupled to the drain electrode D of the power MOSFET. The third IGFET Q3 forms a second current mirror with a p-channel enhancement mode fourth IGFET Q4 having its second main electrode s coupled to the drain electrode of the power MOSFET 2 and its control electrode g coupled to the first main or source electrode s and control electrode g of the third IGFET Q3. The third IGFET Q3 is ratio matched to the fourth IGFET Q4 so that the third IGFET Q3 is capable of carrying a current larger by a predetermined ratio than the fourth IGFET Q4. In this example, the third and fourth IGFETs Q3 and Q4 have the same channel length L, typically 10 micrometers ($\mu$m), while the third IGFET Q3 has a channel width about 25 times that of the fourth IGFET Q4. Thus, the third IGFET Q3 may have a channel width of 500 $\mu$m while the fourth IGFET Q4 may have a channel width of 20 $\mu$m. However, as indicated above, it is the ratio matching and the device characteristics that are important, not the actual widths.

When a suitable reference voltage is provided at the auxiliary voltage supply line 7, a reasonable current Id, typically 1 mA (milliampere) is derived or detected from the drain electrode D of the power MOSFET 2 but at a low voltage so avoiding or at least reducing the possibility of an excessive drain of power from the second voltage supply line 5. If, however, the reference voltage at the voltage supply line 7 is low or the voltage at the gate input voltage terminal GT is low, the power semiconductor switch 1 will draw no current from the load L. Accordingly the open-circuit detection means can be rendered non-operative when required allowing, for example, the open-circuit detection means to be used simply to check the status of a load L immediately before a signal is supplied, for example from a controlling microprocessor, to the power semiconductor switch 1 to render the power semiconductor device 2 conducting. Accordingly, the open-circuit detection means should not significantly affect the normal operation of the switch and, in particular should not derive any current from the second voltage supply line 5 during conduction of the power semiconductor device.

The drain electrode d of the IGFET Q4 is coupled to the drain electrode of an n-channel enhancement mode diode-connected fifth IGFET Q5 having its source electrode coupled to the first voltage supply line 3. The fifth IGFET Q5 forms another current mirror with an n-channel enhancement mode sixth IGFET Q6 having its source electrode coupled to the first voltage supply line 3 and its control electrode coupled to the control electrode of the fifth IGFET Q5. The drain electrode of the sixth IGFET Q6 is coupled to the auxiliary voltage supply line 7 via a resistance of the same value as the resistance coupling the drain electrode of the IGFET Q1 to the auxiliary voltage supply line 7 to enable matching and to ensure that the current is lower than the current drawn from the drain electrode D of the power MOSFET 2 when there is no fault. In the example shown in FIG. 1, the resistance comprises two series-connected resistors R5 and R6 providing a resistance of, typically, 200K (KiloOhms). A further resistor R8 may be coupled in series with the resistors R5 and R6 by breaking a shorting link 9 to increase the resistance to, typically, 250K. The use of this other current mirror enables the open-circuit detection means to be driven from a microprocessor output and enables accurate matching to the current source formed by the resistor R3 and IGFET Q1. The IGFET Q5 could be replaced by a current sensing resistor and the voltage across that current sensing resistor then detected but the accuracy of detection would not be as good.

The junction J1 between the drain electrode d of the sixth IGFET Q6 and the resistor R8 (or the resistor R6 if the resistor R8 is shorted out) is coupled to an output buffer or inverter stage for providing the output signal dependent on the voltage at the second main electrode d of the sixth IGFET Q6. As shown, the output inverter stage is formed by a further n-channel enhancement mode IGFET Q8 having its control electrode g coupled to the junction J1, its drain electrode coupled via a resistor R9 (of typically 300K (KiloOhm)) to the auxiliary voltage supply line 7 and its source electrode s coupled to the first voltage supply line 3.

Disabling means may be provided for disabling the open-circuit detection arrangement when the power semiconductor device is conducting. In the example shown in FIG. 1, the disabling means couples the control electrode g of the further IGFET Q8 to the first voltage supply line 3 when the power semiconductor device 2 is conducting. The disabling means shown in FIG. 1 is formed by another n-channel enhancement mode IGFET Q7 having its first and second main electrodes coupled between the control electrode g of the further IGFET Q8 and the first voltage supply line 3 and its control electrode g coupled to the control terminal G of the power semiconductor device 2 by, in this example, an input buffer. This should ensure that an open-circuit detection indication is provided only when the power semiconductor device 2 is not conducting. This provides a simple but effective way of detecting the voltage at the insulated gate electrode G of the power MOSFET 2. The threshold voltage at which the power MOSFET 2 is determined to be either ON (conducting) or OFF (non-conducting) is the threshold voltage of the inverter formed by the resistor R1 and the IGFET Q9. Other forms of inverters such as Scmitt triggers or voltage comparators could be used if the semiconductor manufacturing technology permits, but may require more semiconductor area.

As shown in FIG. 1, the input buffer comprises an n-channel enhancement mode IGFET Q9 having its control electrode g coupled to the control terminal GT of the power semiconductor device 2 (via a suitable gate series resistance, if considered desirable), its first main electrode s coupled to the first voltage supply line 3 and its second main electrode d coupled via a resistor R1 to the auxiliary voltage supply line 7. The junction J2 between the second main electrode and the resistor R1 is coupled to the control electrode g of an n-channel enhancement mode IGFET Q10 having its first main electrode s coupled to the first voltage supply line 3 and its second main electrode d coupled via a resistor R2 to the auxiliary voltage supply line 7. The junction J3 between the second main electrode and the resistor R2 is coupled to the control electrode g of the IGFET Q7. The IGFETs Q9 and Q10 may be identically matched and may each have a channel length of 5 $\mu$m and a width of 50 $\mu$m. The resistors R1 and R2 may each have a value of 300K. Resistor R1 and IGFET Q9 and resistor R2 and IGFET Q10 form a buffer because the sense of the output from the IGFET Q10 is the same as that from the IGFET Q9. Other types of buffer such as Schmitt triggers or voltage comparators may be used, if the technology allows.

As will be appreciated, each of the enhancement mode IGFETs Q1 to Q10 has a back gate electrode bg. These back gate electrodes bg are coupled to the most appropriate points within the circuit to avoid undesired parasitic bipolar action. Thus, as shown in FIG. 1, the back gates bg of the n-channel IGFETs Q1, Q2 and Q5 to Q10 are connected to the second voltage supply line 6. Although not shown connected in FIG. 1, generally the back gates of the p-channel IGFETs Q3 and Q4 will be coupled to the load terminal 4, that is to the drain electrode D of the power MOSFET 2.

The various components of the power semiconductor switch shown in FIG. 1 are integrated in the same semiconductor body as the power MOSFET 2.

FIGS. 2, 3, 4 and 5 illustrate by way of cross-sectional views of different parts of a semiconductor body 100 how components which may be used in the circuit shown in FIG. 1 may be formed.

The semiconductor body 100 comprises, in this example, a relatively highly doped n conductivity type single crystal silicon substrate 100*a* on which is provided a relatively lowly doped n conductivity type silicon epitaxial layer 100*b* which forms the drain drift region of the MOSFET 2.

Figure 2:
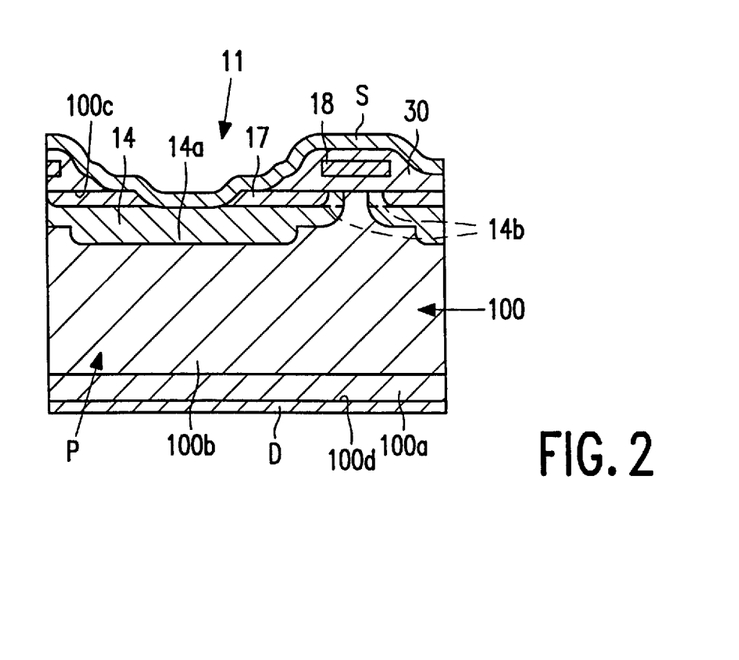
FIGS. 2, 3, 4 and 5 are cross-sectional views of various parts of a semiconductor body for illustrating a cell of a power semiconductor device and components suitable for use in a power semiconductor switch in accordance with the invention.

The n-channel enhancement mode power MOSFET 2 is formed using conventional DMOS processing technology. One source cell 11 of the MOSFET 2 is shown in FIG. 2. The source cell 11 comprises, adjacent one major surface 100*c* of the semiconductor body 100, a p conductivity type body region 14 which contains an n conductivity type source region 17 and defines therewith a conduction channel area 14*b* under the insulated gate (shown as 18 in FIG. 2) of the power MOSFET 2. As shown, the p body region 14 may have a central relatively highly doped subsidiary region 14*a* which is shorted (either as shown by a moat etched through the source region 17 or by masking the source implant) to the source electrode S of the power MOSFET 2 to inhibit parasitic bipolar action. The source and gate (not shown) electrodes S and G are formed by metallization provided on top of an insulating layer 30 and making contact to the source region 17 and insulated gate 18, respectively, via appropriate contact holes. The drain electrode D is provided on the other major surface 100d of the semiconductor body 100.

Figure 3:
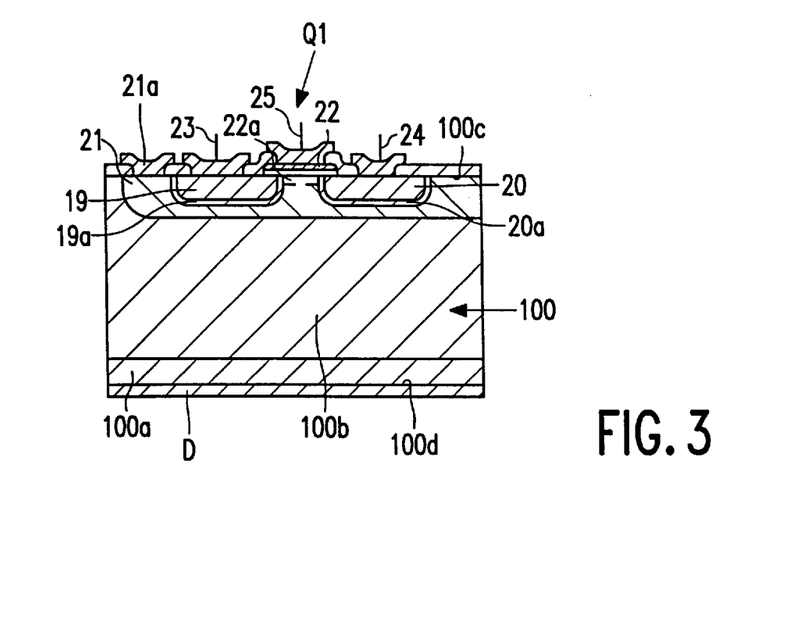

FIG. 3 shows an example of a possible structure for an enhancement mode n-channel or NMOS IGFET, for example the IGFET Q1. As shown in FIG. 3 the IGFET has n conductivity type source and drain regions 19 and 20 diffused in a p conductivity type second region which may, as will be explained below, form an isolation or well region 21. Where it is necessary for the IGFET to withstand high voltages, as will generally be the case for the IGFETs Q1, Q2 and Q5 to Q10, then any suitable conventional form of field relief may be provided and the regions 19 and 20 may be provided with lowly doped extension regions 19a and 20a as shown. An insulated gate 22 is provided over a conduction channel region 22a and source, gate and drain electrodes, 23, 24 and 25 are formed in windows through the insulating layer 30. In this example, a further electrode 21a is shown as coupled to the isolation or well region 21 to enable the back gate of the IGFET to be coupled to the appropriate connection, that is, in the case of IGFET Q1, to the second voltage supply line 6.

Figure 4:
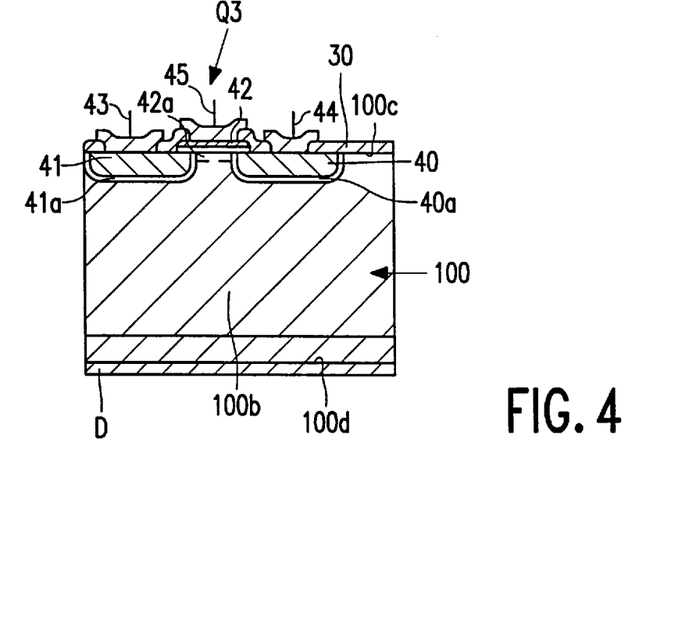

FIG. 4 shows an example of a possible structure for an enhancement mode p-channel or NMOS IGFET, for example the IGFET Q3. As shown in FIG. 4 the IGFET has p conductivity type source and drain regions 40 and 41 diffused into the semiconductor body 100. Where it is necessary for the IGFET to withstand high voltages, as will generally be the case for the IGFETs Q3 and Q4, then any suitable conventional form of field relief may be provided and the regions 40 and 41 may be provided with lowly doped extension regions 40a and 41a as shown. An insulated gate 42 is provided over a conduction channel region 42a and source, gate and drain electrodes, 43, 44 and 45 are formed in windows through the insulating layer 30.

Figure 5:
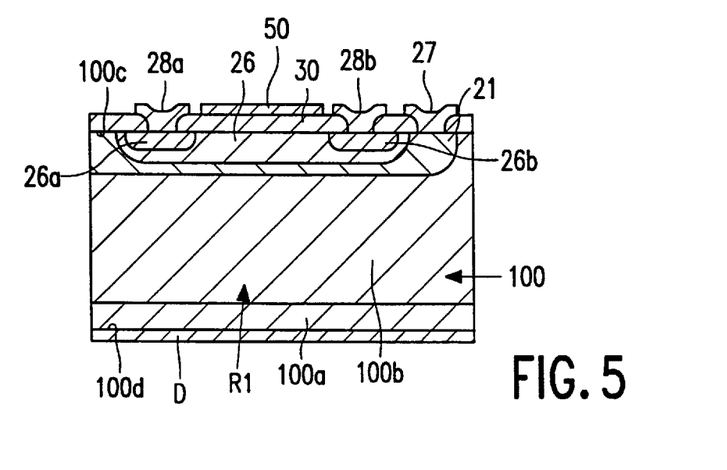

FIG. 5 shows an example of one of the resistors R1 to R9, for example resistor R1. Although, of course, any suitable form of resistor, for example any suitable form of diffused or polycrystalline resistor may be used. As shown in FIG. 5, the resistor R1 comprises a relatively lowly doped n conductivity type region 26 formed within a p conductivity type region which may be part of the isolation or well region 21. Of course, where the back gates of IGFETs Q1, Q" and Q5 to Q10 are coupled to different points within the circuit from the resistors, then separate isolation wells will be required although, for convenience, all components having their back gates connected to the same point may be formed within the same p conductivity type isolation well. Respective electrodes 28a and 28b contact relatively highly doped n conductivity type regions 26a and 26b spaced apart within the relatively lowly doped n conductivity type region 26. A conductive electrostatic screen 50 may be provided over a passivating insulating layer 40 provided over the resistor R1. The screen 50 may be formed of doped polycrystalline silicon. An electrode 27 may be provided to couple the well region 21 to the appropriate reference potential, although, of course, this may not be necessary where the resistor R1 is formed in the same p conductivity type well region 21 as other components one or more of which provides an electrode contacting the isolation well and coupling it to the appropriate reference potential.

In operation of the power semiconductor switch 1 shown in FIG. 1, the resistors R3 and R4 (and R7 if present) and the auxiliary voltage supply line 7 define the current flowing through the IGFET Q1. It is assumed that the first and second voltage supply lines 3 and 5 are coupled to appropriate voltages, generally earth (ground) and battery voltage (typically 12 volts for automotive applications).

The current that will flow in IGFET Q2 will be determined by the ratio of the channel widths of the IGFETs Q1 and Q2 and, in the example given above, will be approximately fifty times that through IGFET Q1. For the values given above and with a voltage of, typically, 4.3 volts at the auxiliary voltage supply line 7, then the current through the IGFET Q1 will be 20 $\mu$A (microamperes) and that through the IGFET Q2 will be about 1 mA. The current through IGFET Q2 will also flow through with IGFET Q3. IGFETs Q2 and Q3 should have sufficiently wide channels that the voltage drop across them is low compared to the possible range of voltages at the second voltage supply line 5 (typically 2 volts where the voltage at the second voltage supply line 5 is a battery voltage of 12 volts) when a current of about 1 mA flows through the IGFETs Q2 and Q3.

The current that will flow through the IGFETs Q4 and Q5 is determined by the current flowing through the IGFET Q3 and the ratio (25:1 in the example given above) of the widths of the IGFETs Q3 and Q4. The current that will flow through the IGFET Q6 is determined by the current flowing through the IGFET Q5 and the ratio (2:1 in the example given above) of the widths of the IGFETs Q5 and Q6. Consequently, the current that will flow through the IGFET Q6 will be approximately equal to that through the IGFET Q1. The drain-source voltage of the IGFET Q6 is approximately equal to the drain-source voltage of the IGFET Q1.

If the load L is present and is not open-circuit, then the voltage at the drain electrode D of the power MOSFET 2 will be high and the IGFETs Q3 and Q2 will conduct a derived or detected current Id equal to the reference current Ir determined by the ratio matching of the IGFETs Q1 and Q2, in this example 1 mA, from the load L. As indicated above, the current through the IGFETs Q4 and Q5 will be determined by the current through the IGFET Q3 in accordance with the ratioed matching of the IGFETs Q3 and Q4. The IGFET Q5 is thus rendered conducting and so will have a low drain-source voltage Vds. The voltage at the control electrode g of the IGFET Q8 will therefore be low and so a high output signal OS will be provided at the junction between the resistor R9 and the drain electrode d of the IGFET Q8. This signal may then be supplied by conventional means to an appropriate controller, generally a microprocessor as indicated above, to provide an indication that the load L is operating normally and that a control signal can be supplied to the control terminal GT to render the power MOSFET 2 conducting. When the power MOSFET 2 is rendered conducting, the high voltage at the control terminal GT causes the IGFET Q9 to conduct, so lowering the voltage at the junction J2 and thus rendering the IGFET Q10 non-conducting so providing a high signal to the control gate g of the IGFET Q7 which then conducts and so lowers the voltage at the control electrode of the IGFET Q8. The disabling means thus bypasses the open-circuit detection means when the power MOSFET 2 is conducting so that the output OS is held high regardless of the drain voltage of the power MOSFET 2 when the power MOSFET 2 is conducting. Accordingly, the open-circuit detection means is only active when the power MOSFET 2 is not being supplied with a control signal to render it conducting, that is the open-circuit detection means is only operative when a difference between an open-circuit load (for example a blown lamp or bulb) and a normally operating load can reliably be detected.

If the load is open-circuited, then the voltage at the drain electrode D of the power MOSFET 2 will be low and so no current can flow in IGFETs Q2 and Q3. Consequently, IGFETs Q4, Q8 and Q6 will all be off or non-conducting so that the gate of the IGFET Q8 will be pulled high, thereby providing a low output signal OS to indicate that the load is open-circuit. If, because of dirt or moisture, a leakage current (that is a current less than the reference current Ir expected by the IGFET Q2) flows across an open-circuit load L, then the IGFETs Q2, Q3, Q4 and Q5 will conduct a derived or detected current Id equal only to the leakage current and not the expected, typically 1 mA, current equal to the reference current Ir. Accordingly the voltage at the drain electrode d of the IGFET Q6 will be high so that the gate of the IGFET Q8 will be pulled high to provide a low output signal OS indicating that the load is open-circuit. The power semiconductor switch 1 thus provides, by virtue of the reference current Ir, a threshold current value so that the load L is not recognized as operating normally if the current drawn from the drain electrode D of the power MOSFET 2 is less than the leakage current, set in this example to 1 mA, which may be expected to be provided by dirt or moisture across an open-circuit load L. Accordingly, the power semiconductor switch 1 is not fooled by a leakage current around the load L into considering the load L to be operating correctly. The value of the current below which the power MOSFET 2 drain current Id is considered to be a load leakage current is set by the reference current at, in the above example, 1 mA. This threshold current is, however, determined by the values of the resistors R3 to R9, the threshold voltages off the IGFETs Q1 and Q8 and the current mirror ratios as mentioned above and may be adjusted as desired to meet particular requirements. The threshold voltage of the inverter formed by the resistor, R9 and the IGFET Q8 should be lower than the voltage at the drain electrodes of the IGFETs Q1 and Q6 when the load L is connected (that is under normal conditions).

The open-circuit detection means may be turned off by causing the voltage at the auxiliary supply line 7 to drop to the voltage of the first voltage supply line 3 using any suitable conventional means so that the reference current drops to zero and no current is drawn from the drain electrode of the power MOSFET 2.

As indicated above, IGFETs Q3 and Q4 are ratio matched p-channel IGFETs while IGFETs Q1, Q2, Q5 and Q6 are ratio matched n-channel IGFETs. P-channel devices may be used without there being a great danger of parasitic bipolar problems because they are always at a bias voltage below that of the substrate (the power MOSFET 2 drain electrode). As used herein, the term ratio matched means that the IGFETs are formed using the same manufacturing process and are integrated close to one another so that, as far as possible, their characteristics only differ because of the difference in their respective channel width/length W/L ratios.

The values of the various components forming the power semiconductor switch 1 will, of course, depend upon the precise nature of the components used and the particular requirements for the power semiconductor switch. Accordingly, the values given above should be considered examples only.

A power semiconductor switch 1 as shown in FIG. 1 provides, by virtue of the mirror current up mirror current down arrangement formed by the IGFETs Q1 to Q5, and the above-mentioned ratio matching accurate and good detection of open-circuit loads with temperature dependent effects being balanced out. Moreover, the two stages of gain provides a sharp, switching point.

Of course, the power semiconductor device may be other than a power MOSFET and could be, for example, formed as an IGBT simply by reversing the conductivity type of the region 100a in FIG. 2, provided, of course, appropriate measures are taken to inhibit undesired parasitic bipolar action where the circuit of, for example, FIG. 1 is also integrated in the same semiconductor body. Similarly, any of the three-terminal normally off devices, for example the IGFETs Q1 to Q10, may be formed as different types of three-terminal normally off devices, for example as bipolar transistors. In addition other circuitry, for example overvoltage or over-temperature protection circuitry may be integrated with the power semiconductor device 2.

Of course, the conductivity types and polarities given above may be reversed and the semiconductor body and any thin film semiconductor layers may be formed of a semiconductor other than silicon for example germanium or a combination of semiconductor materials or even a suitable III-V semiconductor material. In addition, amorphous or microcrystalline semiconductor materials can be used in place of polycrystalline semiconductor materials.

Although the above-described power semiconductor switch is primarily intended for circumstances where complementary MOS technology is difficult to use (except in the circumstances of devices such as IGFETs Q3 and Q4), if a suitable complementary MOS technology is available for forming logic devices integrated with a power semiconductor device for use in any circumstances, then ratioed current sources may be used for the generation of the reference current by replacing the resistor R3 with a p-channel IGFET and replacing resistors R5 and R6 with a matched p-channel IGFET. Also, where inverters are used, the PMOS or CMOS inverters may be used, if the technology permits.

From reading the present disclosure, other modifications and variations will be apparent to persons skilled in the art. Such modifications and variations may involve other features which are already known in the art and which may be used instead of or in addition to features already described herein.

What is claimed is:

1. A power semiconductor switch comprising a power semiconductor device having a first main electrode coupled to a first voltage supply line, a second main electrode coupled to a first terminal for connection via a load to a second voltage supply line and an insulated gate electrode coupled to a control terminal for supplying a gate control signal to enable conduction of the power semiconductor device, and an open-circuit detection arrangement integrated with the power semiconductor device for providing an indication of whether the load coupled to the power semiconductor device is open-circuited, the detection arrangement comprising means for providing a current dependent on the voltage at the second main electrode generated by a current flow between the second main electrode and the second voltage supply line, along a current path through the load and along a leakage current path around the load, means for providing a reference current of greater magnitude than that derived from only the leakage current path when the load is open-circuited, and means for providing an output signal to indicate that the load is operating when the current dependent on the voltage at the second main electrode is greater than the reference current, wherein the reference current providing means comprises a current mirror comprising first and second transistors with the second transistor being capable of carrying a current larger by a predetermined ratio than the first transistor, the first and second transistors each having first and second main electrodes and a control electrode with the first main electrode of each of the first and second transistors being coupled to the first voltage supply line, the second main electrode of the first transistor being coupled to an auxiliary voltage supply line, the first transistor being diode-connected, the control electrodes of the first and second transistors being coupled together and the second main electrode of the second transistor being coupled to receive the current dependent on the voltage at the second main electrode of the power semiconductor device, and wherein the current deriving and output providing means comprises a further current mirror comprising third and fourth transistors with the third transistor being capable of carrying a current larger by a predetermined ratio than the fourth transistor, the third and fourth transistors each having first and second main electrodes and a control electrode with the second main electrode of each of the third and fourth transistors being coupled to the second main electrode of the power semiconductor device, the first main electrode of the third transistor being coupled to the second main electrode of the second transistor, the third transistor being diode-connected, the control electrodes of the third and fourth transistors being coupled together and the first main electrode of the fourth transistor being coupled to an output signal providing arrangement.

2. The power semiconductor switch according to claim 1, wherein the output signal providing arrangement comprises another current mirror comprising fifth and sixth transistors with the fifth transistor being capable of carrying a current larger by a predetermined ratio than the sixth transistor, the fifth and sixth transistors each having first and second main electrodes and a control electrode with the first main electrode of each of the fifth and sixth transistors being coupled to the first voltage supply line, the second main electrode of the fifth transistor being coupled to the first main electrode of the fourth transistor, the fifth transistor being diode-connected, the control electrodes of the fifth and sixth transistors being coupled together, and the second main electrode of the sixth transistor providing a voltage determining the output signal.

3. The power semiconductor switch according to claim 2, wherein the second main electrode of the sixth transistor is coupled via resistance means to the auxiliary voltage supply line and to an output inverter stage for providing the output signal dependent on the voltage at the second main electrode of the sixth transistor.

4. The power semiconductor switch according to claim 3, wherein the output signal inverter stage comprises a further transistor having first and second main electrodes and a control electrode with the control electrode of the further transistor being coupled to the second main electrode of the sixth transistor and the first and second main electrodes of the further transistor being coupled between the first and auxiliary voltage supply lines.

5. The power semiconductor switch according to claim 1, wherein disabling means coupled to the insulated gate electrode of the power semiconductor device are provided for disabling the open-circuit detection arrangement when the power semiconductor device is conducting.

6. The power semiconductor switch according to claim 4, wherein disabling means are provided for coupling the control electrode of the further transistor to the first voltage supply line when the power semiconductor device is conducting.

7. The integrated circuit according to claim 6, wherein the disabling mean comprises another transistor having first and second main electrodes coupled between the control electrode of the further transistor and the first voltage supply line and a control electrode coupled to the control terminal of the power semiconductor device.

8. The power semiconductor switch according to claim 7, wherein the control electrode of said other transistor is coupled to the control terminal of the power semiconductor device by an input buffer.

9. An automotive electrical system comprising first and second voltage supply lines, a load coupled to the second voltage supply line, and a power semiconductor switch for switching the load, the power semiconductor switch comprising a power semiconductor device having a first main electrode coupled to the first voltage supply line, a second main electrode coupled to a first terminal which is connected via the load to the second voltage supply line and an insulated gate electrode coupled to a control terminal for supplying a gate control signal to enable conduction of the power semiconductor device for switching the load, and an open-circuit detection arrangement integrated with the power semiconductor device for providing an indication of whether the load coupled to the power semiconductor device is open-circuited, the detection arrangement comprising means for providing a current dependent on the voltage at the second main electrode generated by a current flow between the second main electrode and the second voltage supply line, along a current path through the load and along a leakage current path around the load, means for providing a reference current of greater magnitude than that derived from only the leakage current path when the load is open-circuited, and means for providing an output signal to indicate that the load is operating when the current dependent on the voltage at the second main electrode is greater than the reference current, wherein the reference current providing means comprises a current mirror comprising first and second transistors with the second transistor being capable of carrying a current larger by a predetermined ratio than the first transistor, the first and second transistors each having first and second main electrodes and a control electrode with the first main electrode of each of the first and second transistors being coupled to the first voltage supply line, the second main electrode of the first transistor being coupled to an auxiliary voltage supply line, the first transistor being diode-connected, the control electrodes of the first and second transistors being coupled together and the second main electrode of the second transistor being coupled to receive the current dependent on the voltage at the second main electrode of the power semiconductor device, and wherein the current deriving and output providing means comprises a further current mirror comprising third and fourth transistors with the third transistor being capable of carrying a current larger by a predetermined ratio than the fourth transistor, the third and fourth transistors each having first and second main electrodes and a control electrode with the second main electrode of each of the third and fourth transistors being coupled to the second main electrode of the power semiconductor device, the first main electrode of the third transistor being coupled to the second main electrode of the second transistor, the third transistor being diode-connected, the control electrodes of the third and fourth transistors being coupled together and the first main electrode of the fourth transistor being coupled to an output signal providing arrangement.

* * * * *